United States Patent

Ohsaki et al.

[11] Patent Number: 5,951,820
[45] Date of Patent: Sep. 14, 1999

[54] METHOD OF PURIFYING AN ORGANOMETALLIC COMPOUND

[75] Inventors: Hiromi Ohsaki; Kazuhiro Hirahara; Toshinobu Ishihara; Isao Kaneko, all of Kubiki-mura, Japan

[73] Assignee: Shin-Etsu Chemical Co., Ltd., Tokyo, Japan

[21] Appl. No.: 08/882,160

[22] Filed: Jun. 25, 1997

[30] Foreign Application Priority Data

Jun. 25, 1996 [JP] Japan .................................. 8-184105

[51] Int. Cl.$^6$ .................................. B01D 1/00; C07C 5/06
[52] U.S. Cl. .................................. 159/47.1; 159/DIG. 16; 159/DIG. 23; 165/61; 165/911; 165/912; 210/737; 210/774; 556/1
[58] Field of Search .................................. 203/91, 73, 94, 203/99, 7; 210/175, 911, 912, 664, 665, 702, 737, 774; 159/27.3, 45, DIG. 8, 47.1, DIG. 16, DIG. 23; 556/1; 165/61, 911, 912, 137, 265, 910; 23/306

[56] References Cited

U.S. PATENT DOCUMENTS

| 5,201,985 | 4/1993 | Medvedieff . |
| 5,250,740 | 10/1993 | Mackey et al. .................. 568/412 |

FOREIGN PATENT DOCUMENTS

| 0658560A1 | 6/1995 | European Pat. Off. . |
| 3225817 | 10/1991 | Japan . |
| 4099312 | 3/1992 | Japan . |
| 7224071 | 8/1995 | Japan . |
| 8054361 | 2/1996 | Japan . |

OTHER PUBLICATIONS

Patent Abstracts of Japan, vol. 014, No. 246 (C–0722), May 25, 1990 & JP 02 067230 A.
Patent Abstracts of Japan, vol. 018, No. 639 (C–1282), Dec. 6, 1994 & JP 06 247977 A.
Patent Abstracts of Japan, vol. 096, No. 005, May 31, 1996 & JP 08 012678 A.
Patent Abstracts of Japan, vol. 015, No. 328 (C–0860), Aug. 21, 1991 & JP 03 123783 A.
Patent Abstracts of Japan, vol. 095, No. 011, Dec. 26, 1995 & JP07 224071 A.

*Primary Examiner*—Virginia Manoharan
*Attorney, Agent, or Firm*—Townsend & Banta

[57] ABSTRACT

An organometallic compound represented by the general formula (I)

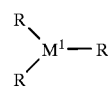

(I)

or the general formula (II)

R-M$^2$-R    (II)

is evaporated, and then passed through the inner tube of a heat exchanger to be precipitated. The heat exchanger is then heated to re-evaporate the organometallic compound, and the re-evaporated organometallic compound is then precipitated in a filling container which is connected to said heat exchanger and cooled down to a prescribed temperature to fill the container.

6 Claims, 3 Drawing Sheets

METHOD OF PURIFYING AN ORGANOMETALLIC COMPOUND

RELATED APPLICATION

This application claims the priority of Japanese Patent application No. 8-184105 filed on Jun. 25, 1996, which is incorporated herein by reference.

BACKGROUND OF THE INVENTION

1. Field of the Invention

This invention relates in general to a method of purifying an organometallic compound, and more particularly to a method of purification to reduce impurities contained in an organometallic compound which is useful as a material used in epitaxial growth by MOCVD (Metal Organic Chemical Vapor Deposition) for manufacturing compound semiconductors.

2. The Prior Art

Recently, use of compound semiconductors of the III–V group and II–VI group has begun in a wide variety of applications such as semiconductor light emitting elements and microwave transistors, and because of their superior characteristics these semiconductors are now used in integrated circuits for high speed computers, integrated circuits for optoelectronics, etc.

The compound semiconductors used in this wide range of applications are manufactured with the MOCVD method using an organometallic compound for the crystal growth method. The MOCVD method is one of crystal growth methods which are frequently used when forming an epitaxial thin film of a compound semiconductor or a mixed crystal semiconductor. It uses an organometallic compound such as trimethyl indium, trimethyl gallium or dimethyl zinc and utilizes their heat decomposition reaction for crystal growth of a thin film.

The characteristics of compound semiconductors formed by the epitaxial growth of an organometallic compound are considerably dependent on the purity of the organometallic compound, and impurities have substantial adverse effects on electrical characteristics and optical characteristics. Therefore, it is necessary to use a highly purified organometallic compound. To meet this requirement, purification distillation has been carried out with a conventional distillation operation. However, the conventional distillation operation alone cannot provide an organometallic compound with sufficiently high purity.

In order to solve this problem, a method in which the organometallic compound containing impurities was exposed to activated charcoal (Japanese examined patent publication Tokko Hei 6-39477) and a method employing a reducing agent such as a metal hydride compound (Tokko Hei 5-29371) were tried.

However, they are not advantageous in a practical sense if used for an organometallic compound which is solid at normal temperatures such as trimethyl indium although these methods are effective for an organometallic compound which is liquid at normal temperatures. This is because most of the distiller or the facility has to be maintained at the melting point of the organometallic compound or higher, the distiller or the facility is complex and the treatment operation is complicated.

BRIEF SUMMARY OF THE INVENTION

The object of the present invention is to provide a method of purifying an organometallic compound efficiently to a high purity.

The inventors conducted earnest research to achieve the object described above and discovered a simple method to enhance the purification of an organometallic compound.

The invention provides a method of purifying an organometallic compound in which an organometallic compound represented by the general formula (I)

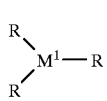
(I)

or the general formula (II)

(where R denotes one or more types of alkyl groups with a carbon number of 1–3, $M^1$ denotes a trivalent metal atom, and $M^2$ denotes a divalent metal atom) is evaporated, the organometallic compound is passed through the inner tube of a heat exchanger which has a double-tube structure with an inner tube and an outer tube wherein the outer tube is cooled down to the melting point of the organometallic compound or lower, the organometallic compound is thus precipitated in the inner tube of the heat exchanger, the outer tube of the heat exchanger is then heated to re-evaporate the organometallic compound precipitated on the inner tube of the heat exchanger, and the re-evaporated organometallic compound is then precipitated in a filling container which is connected to the heat exchanger and cooled down to a prescribed temperature to fill the container, thus purifying the organometallic compound.

The above method may be a method wherein, after re-evaporating the organometallic compound precipitated in the inner tube of the heat exchanger (hereafter referred to as the first heat exchanger) the outer tube of a second heat exchanger which has the same structure as that of the first heat exchanger is cooled down to the melting point of the organometallic compound or lower, the re-evaporated organometallic compound is then passed through the inner tube of the second heat exchanger to re-precipitate the organometallic compound in the inner tube of the second heat exchanger and, after the operation of precipitating the organometallic compound in the inner tube of an additionally connected third (or more) heat exchanger is repeated several times as necessary, the re-evaporated organometallic compound is filled in the filling container.

In the above method, the organometallic compound may be trimethyl indium.

Also, in the above method, the temperature to which the outer tube of each the heat exchanger may be cooled down to the temperature −70 to −10° C., and may be heated up to the temperature 20 to 100° C.

Also, in the above method, the pressure in the system may be $1 \times 10^{-4}$ to 50 torr.

EMBODIMENTS

The configuration of the present invention is described in detail below.

Specific examples of the organometallic compound represented by general formula (I)

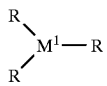
(I)

or general formula (II)

(II)

(where R denotes one or more types of alkyl groups with a carbon number of 1–3, $M^1$ denotes a trivalent metal atom, and $M^2$ denotes a divalent metal atom), which is the subject of the present invention, include trimethyl indium, trimethyl aluminum, triethyl aluminum, trimethyl gallium, triethyl gallium, dimethyl zinc and diethyl zinc. Trimethyl indium is a more relevant example because it is solid at normal temperatures and purification with distillation is difficult.

Figure 1:
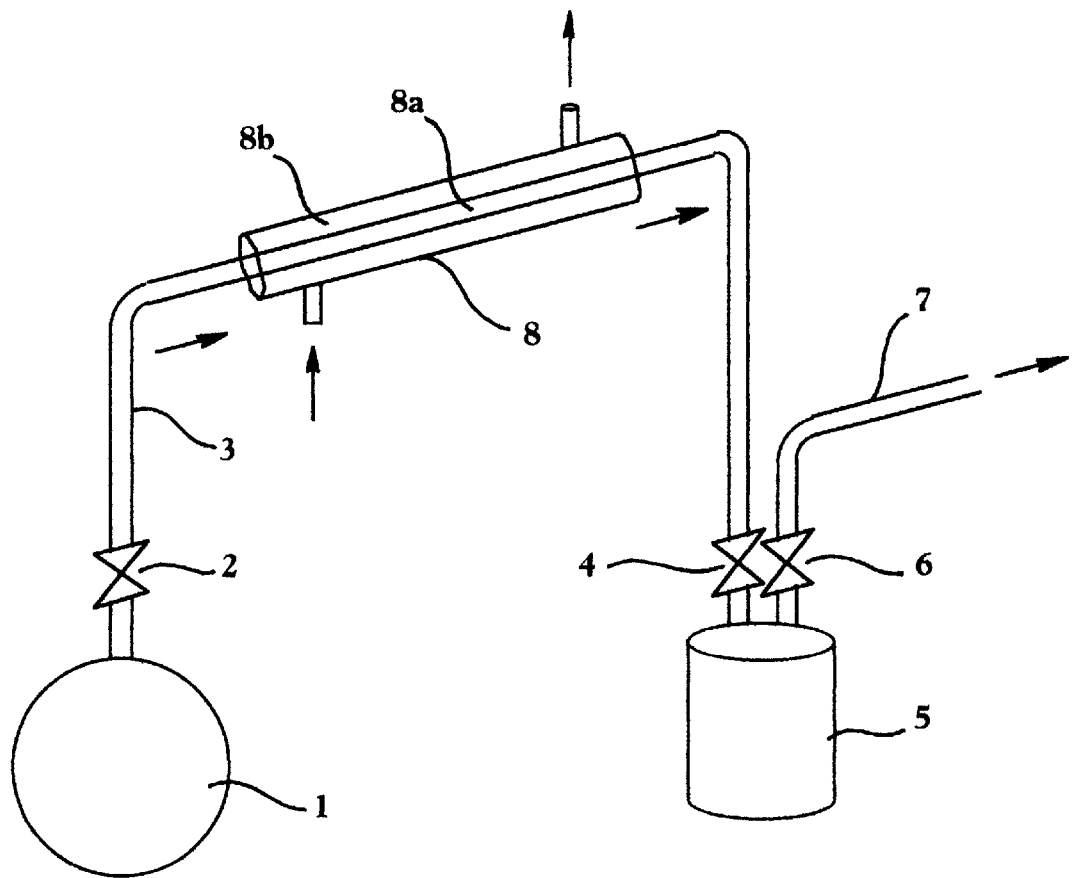
FIG. 1 is a schematic diagram showing an example of the purification apparatus used to implement a method of example 1 of the present invention.

FIG. 1 shows an example of an apparatus used to implement the method of the present invention. A metal container 1 contains the organometallic compound before purification. This container is connected to a heat exchanger 8 via a glass or metal piping 3, and then via a valve 4 to a filling container 5 to be filled with the organometallic compound after purification. Filling container 5 is then connected via a valve 6 to a piping 7 for sending the organometallic compound out of the system.

Heat exchanger 8 has a double-tube structure of an inner tube 8a and an outer tube 8b, and piping 3 is connected to inner tube 8a. The inside of inner tube 8a can be cooled or heated by circulating a heat exchange medium in outer tube 8b. That is, by circulating a cooling medium such as cool water for cooling and warm water, steam, etc. for heating in outer tube 8b, the organometallic compound that passes through inner tube 8a can be precipitated or evaporated. Inner tube 8a should be something which the organometallic compound in a gaseous form can pass through and precipitate on. Glass, metal, etc. are preferable as the material.

When purifying the organometallic compound using the apparatus mentioned above, container 1 is heated up by an electric heater, oil bath, etc. (not shown) to evaporate the organometallic compound in the container. The inside of the system can be either a normal pressure or reduced pressure, but a reduced pressure is preferable to accelerate the operation. Specifically, a range from $1 \times 10^{-4}$ to 50 torr is preferable. If it is less than $1 \times 10^{-4}$ torr then it is hard for the organometallic compound to stick to the inner wall of inner tube 8a of heat exchanger 8, resulting in a lower yield. If it is more than 50 torr then the evaporation rate of the organometallic compound is reduced, resulting in an economically poor practice.

The evaporated organometallic compound passes through opened valve 2 and piping 3 and enters inner tube 8a of heat exchanger 8. Outer tube 8b of heat exchanger 8 is already cooled by circulating a cooling medium and the organometallic compound which passes through inner tube 8a precipitates on the inner wall of inner tube 8a. It is sufficient if the cooling temperature is at the melting point of the organometallic compound or lower. Specifically, a range from −70 to −10° C. is preferable. If it is higher than 10° C. then the precipitation efficiency is poor. If it is lower than −70° C. then the purification efficiency is poor, resulting in an economically poor practice.

Warm water, steam, etc. is then circulated in outer tube 8b to heat it up and re-evaporate the precipitated organometallic compound which is then delivered via opened valve 4 into cooled filling container 5 and precipitates. The heating temperature of heat exchanger 8 is not limited in particular as long as it is higher than normal temperatures, but a preferable range is 20 to 100° C. If it is lower than 20° C. then it is harder to evaporate the organometallic compound. If it is higher than 100° C. it is uneconomical and there will be no improvement in the efficiency. The temperature of filling container 5 should be as low as possible. Specifically, −30° C. or lower is preferable.

Figure 2:
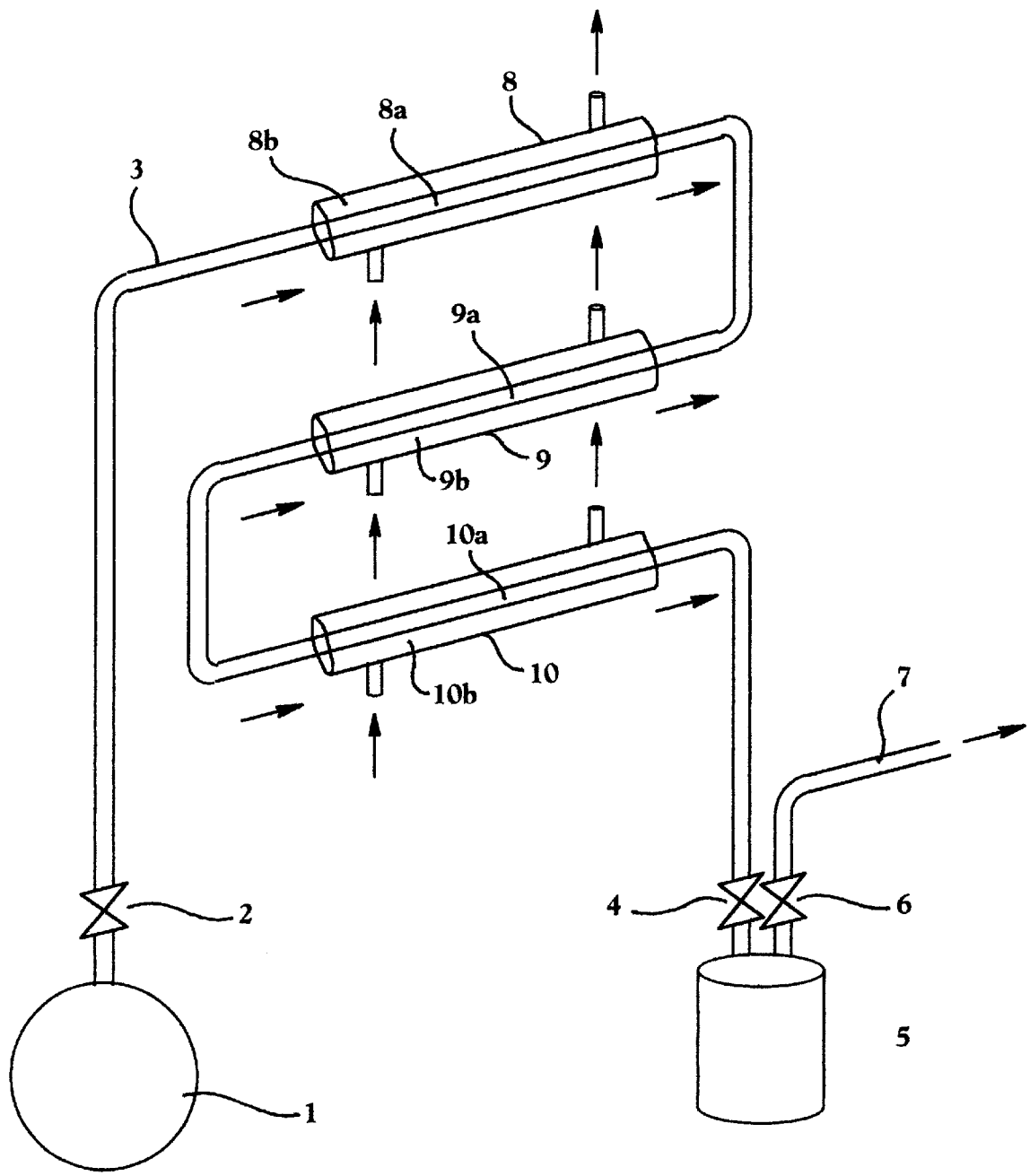
FIG. 2 is a schematic diagram showing an example of the purification apparatus used to implement a method of example 2 of the present invention.

FIG. 2 shows another example of an apparatus used to implement the method of the present invention. The basic configuration of this apparatus is the same as that of the apparatus shown in FIG. 1 except for the fact that in this apparatus 3 heat exchangers are connected in a serial fashion.

When purifying an organometallic compound using this apparatus, a container 1 is heated in the same manner as in the example described above to evaporate the organometallic compound in the container, and the organometallic compound passes through an inner tube 8a of a first stage heat exchanger 8 which is already cooled by circulating a cooling medium in an outer tube 8b and precipitates on the inner wall of inner tube 8a. Warm water and such is then circulated in outer tube 8b to heat it up and the organometallic compound is re-evaporated. The organometallic compound then re-precipitates on the inner wall of a cooled inner tube 9a of a second stage heat exchanger 9. Precipitation and evaporation are carried out again in a third stage heat exchanger 10 and finally a cooled filling container is filled by precipitation.

The number of stages of heat exchangers can be increased or decreased as necessary. The precipitation evaporation operation is repeated several times as necessary and then filling container 5 is filled. Although one precipitation evaporation operation, as described earlier, is sufficient enough for actual use, the organometallic compound is highly purified by repeating the operation two or three times. Repeating the precipitation evaporation operation more than 3 times is uneconomical and not preferable.

EXAMPLES

The present invention is described in detail below by referring to examples. Needless to say, the technical scope of the present invention is not limited to these examples.

Example 1

Using the glass apparatus shown in FIG. 1, 60 g of unpurified trimethyl indium containing impurities was put into a glass flask 1 and set up. A vacuum pump is used to decrease the pressure in the system down to 0.01 torr. A cooling medium cooled down to −20° C. was circulated in outer tube 8b of heat exchanger 8 (the inner diameter of the double-tube is 25 mm and the length is 1000 mm) to cool heat exchanger 8. A mantle heater was then attached to glass flask 1 which contains the trimethyl indium to heat it up to approximately 50° C. The trimethyl indium evaporated and precipitated in inner tube 8a of heat exchanger 8.

After all the trimethyl indium in glass flask 1 was evaporated and precipitated, the lower half of filling container 5 (200 ml container made of SUS) was soaked in methanol which contains dry ice at approximately −70° C. After removing the cooling medium from outer tube 8b of heat exchanger 8, warm water maintained at 35° C was recirculated to evaporate the trimethyl indium, which precipitated in filling container 5.

Filling container 5 was then disconnected and the trimethyl indium was taken out in a glove box filled with an $N_2$ atmosphere. The metal impurity content and the oxide content were analyzed using a quantometer and a $^1$H-NMR. The results are shown in Table 1. Table 1 indicates that the trimethyl indium after the treatment has a higher purity compared with before the treatment.

TABLE 1

| Impurity in trimethyl indium | Al | Ca | Cu | Fe | Mg | Si | Zn | Oxide |
|---|---|---|---|---|---|---|---|---|
| Before treatment | 0.5 | <0.1 | 0.2 | 0.5 | 0.2 | 1.0 | 0.2 | Detected |
| After treatment | <0.1 | <0.1 | <0.1 | <0.1 | <0.1 | <0.1 | <0.1 | Trace |

Example 2

As shown in FIG. 2, an apparatus which had been expanded to have three stages of heat exchangers was used and precipitation was carried out in heat exchanger 8 in the manner shown in example 1. The cooling medium cooled down to −15° C. was recirculated in an outer tube 9b of a heat exchanger 9 to cool heat exchanger 9. The cooling medium of outer tube 8b of heat exchanger 8 was then removed and warm water maintained at 35° C. was recirculated to gradually evaporate the precipitated trimethyl indium, which then precipitated in heat exchanger 9. Precipitation was carried out in the same manner in heat exchanger 10 to repeat evaporation/precipitation a third time. Other than this difference, trimethyl indium was purified in the manner shown in example 1. The results are shown in Table 2. Table 2 indicates that the trimethyl indium after the treatment has a sufficiently higher purity compared with before the treatment.

TABLE 2

| Impurity in trimethyl indium | Al | Ca | Cu | Fe | Mg | Si | Zn | Oxide |
|---|---|---|---|---|---|---|---|---|
| Before treatment | 0.5 | <0.1 | 0.2 | 0.5 | 0.2 | 1.0 | 0.2 | Detected |
| After treatment | <0.1 | <0.1 | <0.1 | <0.1 | <0.1 | <0.1 | <0.1 | Not detected |

Example 3

Purification was carried out in the same manner as in Example 1 except for the fact that the degree of vacuum in the system was 1 torr and the cooling temperature and the heating temperature of the heat exchanger were −10° C. and 50° C., respectively. The results are shown in Table 3. Table 3 indicates that the trimethyl indium after the treatment has a sufficiently higher purity compared with before the treatment.

TABLE 3

| Impurity in trimethyl indium | Al | Ca | Cu | Fe | Mg | Si | Zn | Oxide |
|---|---|---|---|---|---|---|---|---|
| Before treatment | 0.5 | <0.1 | 0.2 | 0.5 | 0.2 | 1.0 | 0.2 | Detected |
| After treatment | <0.1 | <0.1 | <0.1 | <0.1 | <0.1 | <0.1 | <0.1 | Not detected |

Comparative Example 1

Figure 3:
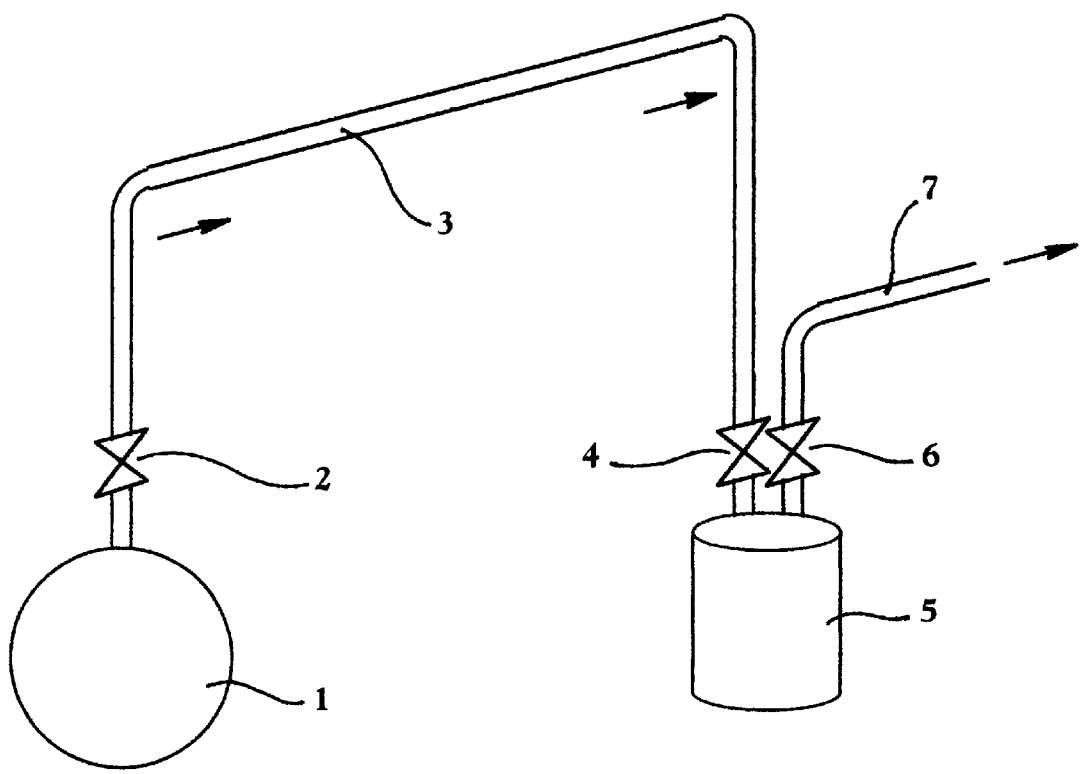
FIG. 3 is a schematic diagram showing an example of the purification apparatus used to implement a method of comparative example 1.

Preparation was carried out in the same manner as in example 1 except for the fact that the heat exchanger was not used, as shown in FIG. 3, and the unpurified raw material was heated and then the filling container was cooled and filled. The results are shown in Table 4. As indicated in Table 4, the trimethyl indium after the treatment had impurities similar to the trimethyl indium before the treatment.

TABLE 4

| Impurity in trimethyl indium | Al | Ca | Cu | Fe | Mg | Si | Zn | Oxide |
|---|---|---|---|---|---|---|---|---|
| Before treatment | 0.5 | <0.1 | 0.2 | 0.5 | 0.2 | 1.0 | 0.2 | Detected |
| After treatment | 0.4 | <0.1 | 0.2 | 0.5 | 0.1 | 0.6 | 0.2 | Detected |

Comparative Example 2

Preparation was carried out in the same manner as in example 1 except for the fact that the cooling temperature and the heating temperature of the heat exchanger were −75° C. and 110° C., respectively. The results are shown in Table 5. As indicated in Table 5, the trimethyl indium after the treatment had impurities similar to the trimethyl indium before the treatment.

TABLE 5

| Impurity in trimethyl indium | Al | Ca | Cu | Fe | Mg | Si | Zn | Oxide |
|---|---|---|---|---|---|---|---|---|
| Before treatment | 0.5 | <0.1 | 0.2 | 0.5 | 0.2 | 1.0 | 0.2 | Detected |
| After treatment | 0.3 | <0.1 | <0.1 | 0.4 | <0.1 | 0.8 | <0.1 | Detected |

What is claimed is:

1. A method of purifying an organometallic compound, comprising the steps of:

(a) evaporating an organometallic compound selected from a compound represented by the general formula (I)

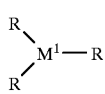

(I)

and a compound represented by the general formula (II)

(II)

wherein R denotes alkyl groups having a carbon number of 1–3, $M^1$ denotes a trivalent metal atom, and $M^2$ denotes a divalent metal atom, said organometallic compound with impurities being contained in a first container;

(b) precipitating said organometallic compound by passing said organometallic compound through an inner tube of a first heat exchanger which has a double-tube structure having an inner tube and an outer tube wherein the outer tube is cooled down to the melting point of said organometallic compound or lower;

(c) re-evaporating said organometallic compound precipitated on said inner tube of the first heat exchanger by heating said outer tube of the first heat exchanger;

(d) re-precipitating said evaporated organometallic compound after said re-evaporating step in the inner tube of said first heat exchanger by passing said organometallic compound through the inner tube of a second heat exchanger which has the same structure as that of said first heat exchanger to cool down to the melting point of said organometallic compound;

(e) re-evaporating said organometallic compound re-precipitated on said inner tube of said second heat exchanger by heating said outer tube of said second heat exchanger;

(f) repeating said re-precipitating step (d) and said re-evaporating step (e) in the inner tube of additionally connected third or more heat exchangers for several times as necessary; and (g) re-precipitating said re-evaporated organometallic compound in a filling second container which is in fluid communication with said heat exchangers and cooled down to a prescribed temperature to fill the filling second container, wherein the outer tube of each of said heat exchangers is cooled down to a temperature of from −70° C. to −10° C., and heated up to a temperature of from 20° C. to 100° C.

2. The method of purifying an organometallic compound of claim 1 wherein said organometallic compound is trimethyl indium.

3. The method of purifying an organometallic compound of claim 1 wherein the method is carried out at a pressure of from $1\times10^{-4}$ to 50 torr.

4. A method of purifying an organometallic compound, comprising the steps of:

(a) evaporating an organometallic compound selected from a compound represented by the general formula (I)

and a compound represented by the general formula (II)

wherein R denotes alkyl groups having a carbon number of 1–3, $M^1$ denotes a trivalent metal atom, and $M^2$ denotes a divalent metal atom, said organometallic compound with impurities being contained in a first container;

(b) precipitating said organometallic compound by passing said organometallic compound through an inner tube of a first heat exchanger which has a double-tube structure having an inner tube and an outer tube wherein the outer tube is cooled down to the melting point of said organometallic compound or lower;

(c) re-evaporating said organometallic compound precipitated on said inner tube of the first heat exchanger by heating said outer tube of the first heat exchanger;

(d) re-precipitating said evaporated organometallic compound after said re-evaporating step in the inner tube of said first heat exchanger by passing said organometallic compound through the inner tube of a second heat exchanger which has the same structure as that of said first heat exchanger to cool down to the melting point of said organometallic compound;

(e) re-evaporating said organometallic compound re-precipitated on said inner tube of said second heat exchanger by heating said outer tube of said second heat exchanger;

(f) repeating said re-precipitating step (d) and said re-evaporating step (e) in the inner tube of additionally connected third or more heat exchangers for several times as necessary; and (g) re-precipitating said re-evaporated organometallic compound in a filling second container which is in fluid communication with said heat exchangers and cooled down to fill the filling second container, wherein the method is carried out at a pressure of from $1\times10^{-4}$ to 50 torr.

5. The method of purifying an organometallic compound of claim 4 wherein the outer tube of each said heat exchangers is cooled down to the temperature of −70 to −10° C., and heated up to the temperature of 20 to 100° C.

6. A method of purifying an organometallic compound of claim 4 wherein said organometallic compound is trimethyl indium.

* * * * *